US010060988B2

(12) United States Patent
Sekiguchi

(10) Patent No.: US 10,060,988 B2
(45) Date of Patent: Aug. 28, 2018

(54) SEMICONDUCTOR DEVICE AND A METHOD FOR MEASURING A CELL VOLTAGE

(71) Applicant: LAPIS Semiconductor Co., Ltd., Yokohama (JP)

(72) Inventor: Masaru Sekiguchi, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 134 days.

(21) Appl. No.: 15/334,442

(22) Filed: Oct. 26, 2016

(65) Prior Publication Data
US 2017/0123010 A1   May 4, 2017

(30) Foreign Application Priority Data
Oct. 28, 2015   (JP) ................................ 2015-212065

(51) Int. Cl.
*G01R 31/36* (2006.01)
*H02J 7/00* (2006.01)

(52) U.S. Cl.
CPC ..... *G01R 31/3658* (2013.01); *G01R 31/3648* (2013.01); *H02J 7/0021* (2013.01)

(58) Field of Classification Search
CPC ............ G01R 31/3648; G01R 31/3658; G01R 31/3627; H02J 7/0021
USPC ................. 320/116–124, 134; 327/100, 103, 327/333–335; 324/433–434, 537
See application file for complete search history.

(56) References Cited

U.S. PATENT DOCUMENTS

| 8,836,341 B2* | 9/2014 | Inoue | G01R 31/025 324/433 |
| 2012/0044010 A1* | 2/2012 | Murakami | G01R 31/362 327/333 |
| 2012/0098547 A1* | 4/2012 | Inoue | G01R 31/025 324/537 |
| 2014/0205865 A1* | 7/2014 | Matsuo | G01R 31/362 429/7 |

FOREIGN PATENT DOCUMENTS

| JP | 2010-060435 A | 3/2010 |
| JP | 2011-232161 A | 11/2011 |

* cited by examiner

*Primary Examiner* — Jay Patidar
(74) *Attorney, Agent, or Firm* — Rabin & Berdo, P.C.

(57) ABSTRACT

A semiconductor device is performed a cell voltage measurement control for measuring each cell voltage of each target battery cell among a plurality of battery cells connected in series, using a difference voltage output circuit having first and second input terminals. In the measurement control, first and second connection states are formed with respect to each target battery cell so that each cell voltage is sequentially measured. Anode and cathode of each target battery cell are connected to the first and second input terminals in the first connection state, respectively, and the anode and cathode are connected to the second and first input terminal in a second connection state, respectively. Among the first and second connection states, a connection state that is first formed for a current target battery cell is the same as a connection state that has been last formed for a previous target battery cell.

9 Claims, 9 Drawing Sheets

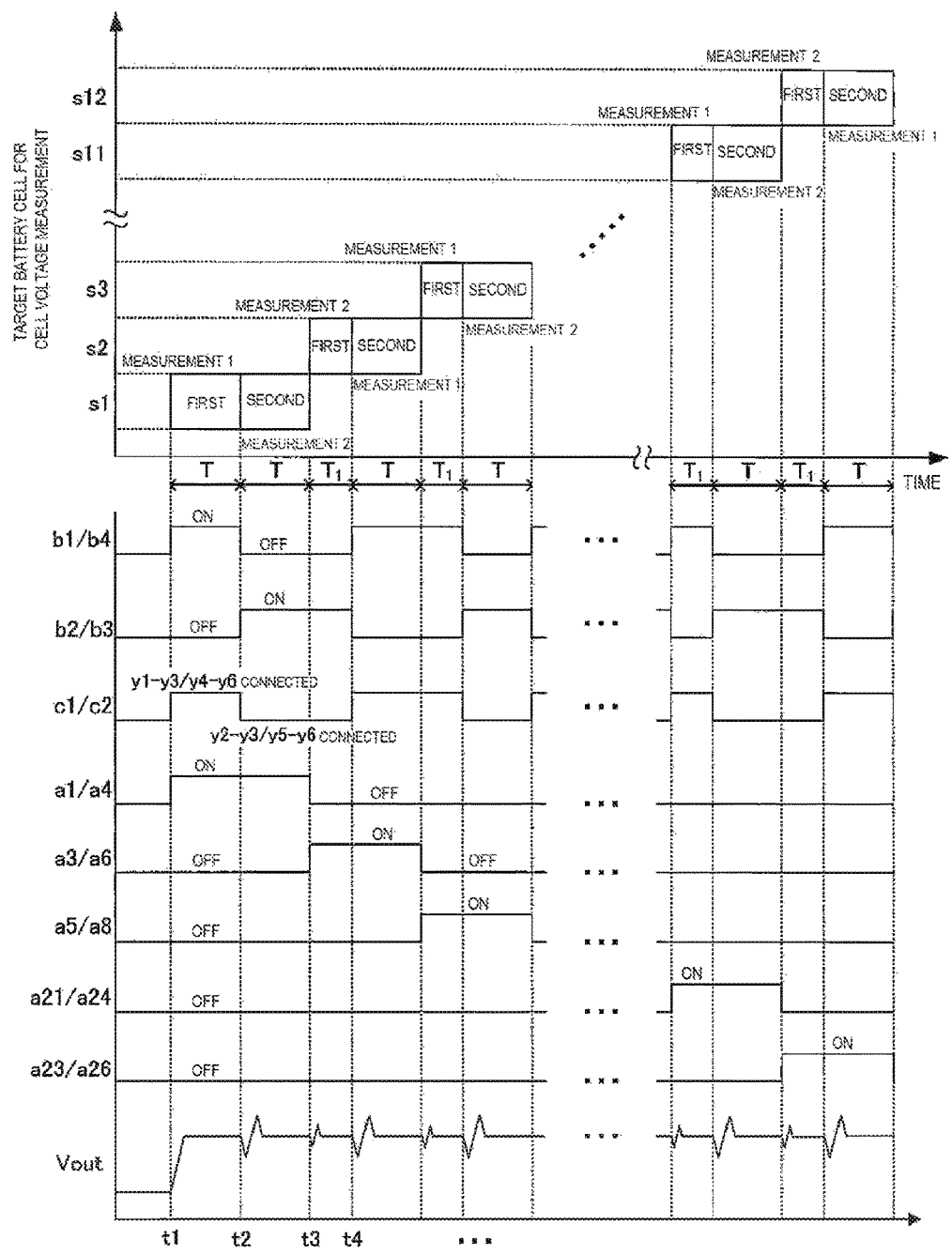

SEMICONDUCTOR DEVICE AND A METHOD FOR MEASURING A CELL VOLTAGE

TECHNICAL FIELD

The present invention relates to a semiconductor device and a method for measuring a cell voltage.

BACKGROUND ART

As a technique for measuring respective voltages of a plurality of battery cells connected to each other in series, the following technique is known. Japanese Patent Application Laid-Open Publication No. 2010-60435 discloses a voltage detection device including: a plurality of voltage input nodes; a pair of detection input nodes, a switch unit including a plurality of switches that turn on or off the connection between the plurality of voltage input nodes and the pair of detection input nodes; and a first detection signal generation unit that amplifies voltages inputted to each of the pair of detection input nodes by differing gains, respectively, and generates a first detection signal according to the sum of or difference between the amplification results, for example. The voltage detection device has: a control unit that selects a pair of voltage input nodes from among the plurality of voltage input nodes, and controls the switch unit such that the selected pair of voltage nodes are connected to the pair of detection input nodes in two patterns with differing polarities; and a second detection signal generation unit that generates a second detection signal according to the difference between the two first detection signals generated by the first detection signal generation unit in the two connection patterns.

Meanwhile, Japanese Patent Application Laid-Open Publication No. 2011-232161 discloses a configuration in which the cell voltage is calculated using an analog level shifter that outputs the difference between voltages inputted to a pair of input terminals.

SUMMARY OF THE INVENTION

When measuring the cell voltages of the respective battery cells constituting a battery assembly using an analog level shifter such as the one disclosed in Japanese Patent Application Laid-Open Publication No. 2011-232161, there are cases in which an offset voltage in an operational amplifier constituting the analog level shifter is outputted together with the measured cell voltage. One method to cancel out the offset voltage is to perform forward direction measurement in which the input voltage, which is inputted to the pair of input terminals included in the operational amplifier, is inputted in the forward direction and the cell voltage is measured, and perform reverse direction measurement in which the input voltage is inputted in the reverse direction and the cell voltage is measured, and to average the voltage values obtained by the measurements above. When performing forward direction measurement, the operational amplifier is given a circuit connection corresponding to forward direction measurement, and when performing reverse direction measurement, the operational amplifier is given a circuit connection corresponding to reverse direction measurement.

In other words, the circuit connection of the operational amplifier is switched depending on whether forward direction measurement or reverse direction measurement is to be performed. When sequentially measuring the cell voltage of each of the plurality of battery cells, the following problems occur when, for example, the first measurement of each battery cell is always forward direction measurement and the second measurement is always reverse direction measurement, or when the first measurement is always reverse direction measurement and the second measurement is always forward direction measurement.

That is, if the cell voltage of each battery cell is measured by the method above, it is necessary to switch the circuit connection of the operational amplifier constituting the analog level shifter when performing both the first measurement and second measurement for each battery cell. However, immediately after switching the circuit connection of the operational amplifier, the output voltage of the operational amplifier is unstable, and some time is needed until the output voltage is stable. Thus, when switching the circuit connection of the operational amplifier for both the first measurement and second measurement performed for each battery cell, a long period of time is required until measurement of cell voltage for all battery cells is completed.

The present invention takes into consideration the above points, and an object thereof is to provide a semiconductor device and a cell voltage measurement method by which it is possible to shorten, compared to conventional configuration, the measurement time for when a plurality of cell voltage measurements are taken including forward direction measurement and reverse direction measurement for each of the plurality of battery cells.

A semiconductor device according to an aspect of the invention for measuring a cell voltage of each of a plurality of serially-connected battery cells in a battery assembly, each battery cell having an anode and a cathode, the semiconductor device includes a plurality of cell voltage input terminals for connecting the plurality of serially-connected battery cells thereto, each battery cell corresponding to two of the cell voltage input terminals for respectively connecting the anode and the cathode of each battery cell, a difference voltage output circuit having a first input terminal and a second input terminal, and being configured to output a difference voltage based on a difference between voltages inputted respectively to the first and second input terminals, a connection circuit configured to connect each battery cell to the different voltage output circuit in either a first connection state in which two cell voltage input terminals corresponding to each battery cell are respectively connected to the first and second input terminals, or a second connection state in which the two cell voltage input terminals corresponding to each battery cell are respectively connected to the second and first input terminals, and a control unit configured to control the connection circuit for sequentially measuring the cell voltages of the serially-connected battery cells, by, for each battery cell, connecting each battery cell to the difference voltage output circuit twice, each in a different one of the first and second connection states for consecutively performing a first voltage measurement and a second voltage measurement on each battery cell, wherein a connection state in which the first voltage measurement is performed on each battery cell is the same as a connection state in which the second voltage measurement is performed on one of the battery cells measured immediately prior thereto.

A method according to an aspect of the invention for measuring a cell voltage of each of a plurality of serially-connected battery cells in a battery assembly using a difference voltage output circuit having first and second input terminals, the method including the steps of: sequentially measuring the cell voltages of the serially-connected battery cells by, for each battery cell, consecutively performing a first voltage measurement and a second voltage measurement on each battery cell, during which each battery cell is connected to the different voltage output circuit twice, each in a different one of a first connection state, in which an anode voltage of each battery cell is inputted to the first input terminal, and a cathode voltage of each battery cell is inputted to the second input terminal, and a second connection state, in which the anode voltage is inputted to the second input terminal, and the cathode voltage is inputted to the first input terminal, wherein a connection state in which the first voltage measurement is performed on each battery cell is the same as a connection state in which the second voltage measurement is performed on one of the battery cells measured immediately prior thereto.

According to the semiconductor device and the method for measuring a cell voltage of the present invention, it is possible to shorten, compared to conventional configuration, the measurement time for when a plurality of cell voltage measurements are taken including forward direction measurement and reverse direction measurement for each of the plurality of battery cells.

BRIEF DESCRIPTION OF THE DRAWINGS

FIG. 3 is a timing chart showing a measurement method for cell voltage according to the embodiment of the present invention.

DETAILED DESCRIPTION OF EMBODIMENTS

Figure 1:
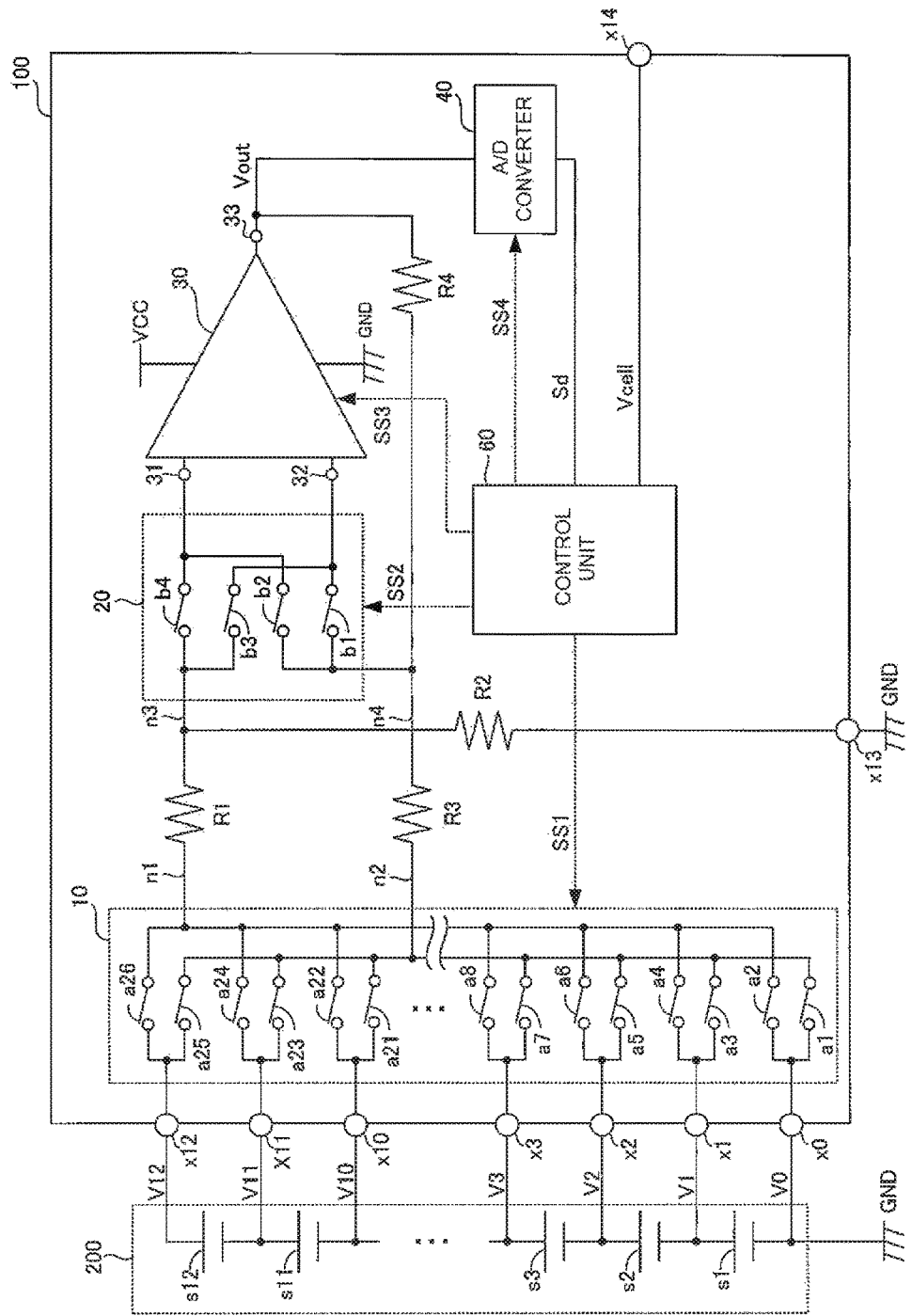
FIG. 1 is a circuit block diagram showing a semiconductor device according to an embodiment of the present invention.

Examples of embodiments of the present invention will be explained below with reference to the drawings. The same or equivalent components and portions in the drawings are assigned the same reference characters.

Embodiment 1

FIG. 1 is a circuit block diagram showing a semiconductor device 100 according to an embodiment of the present invention. The semiconductor device 100 constitutes a battery monitoring integrated circuit (IC) having the function of measuring the cell voltage of each of a plurality of battery cells connected in series, which constitute a battery assembly. Cell voltage is the voltage between anode and cathode of one battery cell. FIG. 1 shows, as one example, a battery assembly 200 including 12 battery cells s1 to s12, which are connected in series, together with the semiconductor device 100. In the battery assembly 200, the cathode of the lowest potential battery cell s1 is connected to ground potential (GND), for example.

The semiconductor device 100 has a battery cell selection circuit 10, an input voltage switching circuit 20, an analog level shifter constituted of resistors R1 to R4 and an operational amplifier 30, an A/D converter 40, and a control unit 60. Also, the semiconductor device 100 has cell voltage input terminals x0 to x12, a ground terminal x13, and an output terminal x14.

The cell voltage input terminals x0 to x12 are terminals for inputting voltage formed at the anode or cathode of each of the battery cells s1 to s12 constituting the battery assembly 200. A voltage V0 (ground potential) of the cathode of the battery cell s1 is inputted to the cell voltage input terminal x0. Voltages V1 to V11 of the connection points between adjacent battery cells are inputted, respectively, to the cell voltage input terminals x1 to x11. A voltage V12 of the anode of the battery cell s12 is inputted to the cell voltage input terminal x12.

The battery cell selection circuit 10 has a group of switches constituted of a plurality of switches a1 to a26 that selectively connect the cell voltage input terminals x0 to x12 to the nodes n1 and n2. Of the switches a1 to a26, one end each of two corresponding switches is connected to the cell voltage input terminals x0 to x12. The other end of one of the two switches connected to each cell voltage input terminal is connected to the node n1, and the other end of the other switch is connected to the node n2. For example, one end each of the switches a1 and a2 is connected to the cell voltage input terminal x0, the other end of the switch a1 is connected to the node n2 and the other end of the switch a2 is connected to the node n1. By the switch a1 being switched on, the voltage V0 of the cathode of the battery cell s1 is outputted to the node n2, and by the switch a2 being on, the voltage V0 of the cathode of the battery cell s1 is outputted to the node n1. Also, by the switches a3 and a6 being switched on, for example, the voltage V1 of the cathode of the battery cell s2 is outputted to the node n2, and the voltage V2 of the anode of the battery cell s2 is outputted to the node n1. In this manner, the cell voltage of the battery cell s2 is in a measurable state. The switches a1 to a26 are turned on/off on the basis of a control signal SS1 supplied by the control unit 60.

The operational amplifier 30, which together with the resistors R1 and R4 constitutes the analog level shifter, has a first input terminal 31, a second input terminal 32, and an output terminal 33. The operational amplifier 30 outputs from the output terminal 33 a difference voltage Vout, calculated by first calculating the difference between a voltage inputted to the first input terminal 31 and a voltage inputted to the second input terminal 32, and amplifying this difference by an amplification ratio determined by the resistance of the resistors R1 to R4. In the present embodiment, the resistors R1 to R4 have the same resistance, and the amplification ratio is set to 1. In other words, the analog level shifter converts the difference between the voltage inputted to the node n1 and the voltage inputted to the node n2, to a voltage based on ground potential, and outputs the converted voltage. The operational amplifier 30 switches the internal circuit connection on the basis of a control signal SS3 supplied by the control unit 60. This point is covered later along with the internal configuration of the operational amplifier 30.

One end of the resistor R1 is connected to the node n1 and the other end is connected to the node n3. One end of the resistor R2 is connected to the other end (node n3) of the resistor R1, and the other end is connected to ground potential through the ground terminal x13. One end of the resistor R3 is connected to the node n2 and the other end is connected to the node n4. One end of the resistor R4 is connected to the other end (node n4) of the resistor R3, and the other end is connected to the output terminal 33 of the operational amplifier 30.

The input voltage switching circuit 20 has a group of switches including a plurality of switches b1 to b4 that selectively connect the nodes n3 and n4 to the first input terminal 31 and the second input terminal 32 of the operational amplifier 30. By the switches b1 and b4 being on, for example, the node n3 is connected to the first input terminal 31 of the operational amplifier 30 through the switch b4, and the node n4 is connected to the second input terminal 32 of the operational amplifier 30 through the switch b1. On the other hand, by the switches b2 and b3 being on, the node n3 is connected to the second input terminal 32 of the operational amplifier 30 through the switch b3, and the node n4 is connected to the first input terminal 31 of the operational amplifier 30 through the switch b2. The switches b1 to b4 turn on/off on the basis of a control signal SS2 supplied by the control unit 60.

The A/D converter 40 converts the difference voltage Vout outputted from the operational amplifier 30 to digital data Sd, and supplies this to the control unit 60. The A/D converter 40 performs A/D conversion on the basis of a control signal SS4 supplied by the control unit 60.

The control unit 60 controls switches a1 to a26 so as to be on/off by supplying the control signal SS1 to the battery cell selection circuit 10, and controls the switches b1 to b4 so as to be on/off by supplying the control signal SS2 to the input voltage switching circuit 20. The control unit 60 controls the battery cell selection circuit 10 and the input voltage switching circuit 20 so as to select one battery cell among battery cells a1 to a26 as a target battery cell, and to form a first connection state and a second connection state with respect to each battery cell, thereby a cell voltage of each target battery cell is sequentially measured. In the first connection state, one cell voltage input terminal that is connected to an anode of the target battery cell is connected to the first input terminal 31, another cell voltage input terminal that is connected to a cathode of the target battery cell is connected to the second input terminal 32. For example, if the one cell voltage input terminal is x0, the another cell voltage input terminal is x1 and the target battery cell is s1. In that case, in the second connection state, the cell voltage input terminal x1 that is connected to the cathode of the target battery cell s1 is connected to the second input terminal 32, the cell voltage input terminal x0 that is connected to the anode of the target battery cell s1 is connected to the first second input terminal 31. Also, the control unit 60 switches the internal circuit connection of the operational amplifier 30 by supplying the control signal SS3 to the operational amplifier 30, and controls the A/D conversion timing in the A/D converter 40 by supplying the control signal SS4 to the A/D converter 40. Additionally, the control unit 60 performs an operation process to be described later on the digital data Sd supplied from the A/D converter 40 to output a data signal Vcell indicating the cell voltage of the battery cells s1 to s12. The data signal Vcell can be extracted from the output terminal x14 to outside of the semiconductor device 100. A register (not shown) for storing the data signal Vcell may be provided inside or outside of the control unit 60.

Figure 2A:
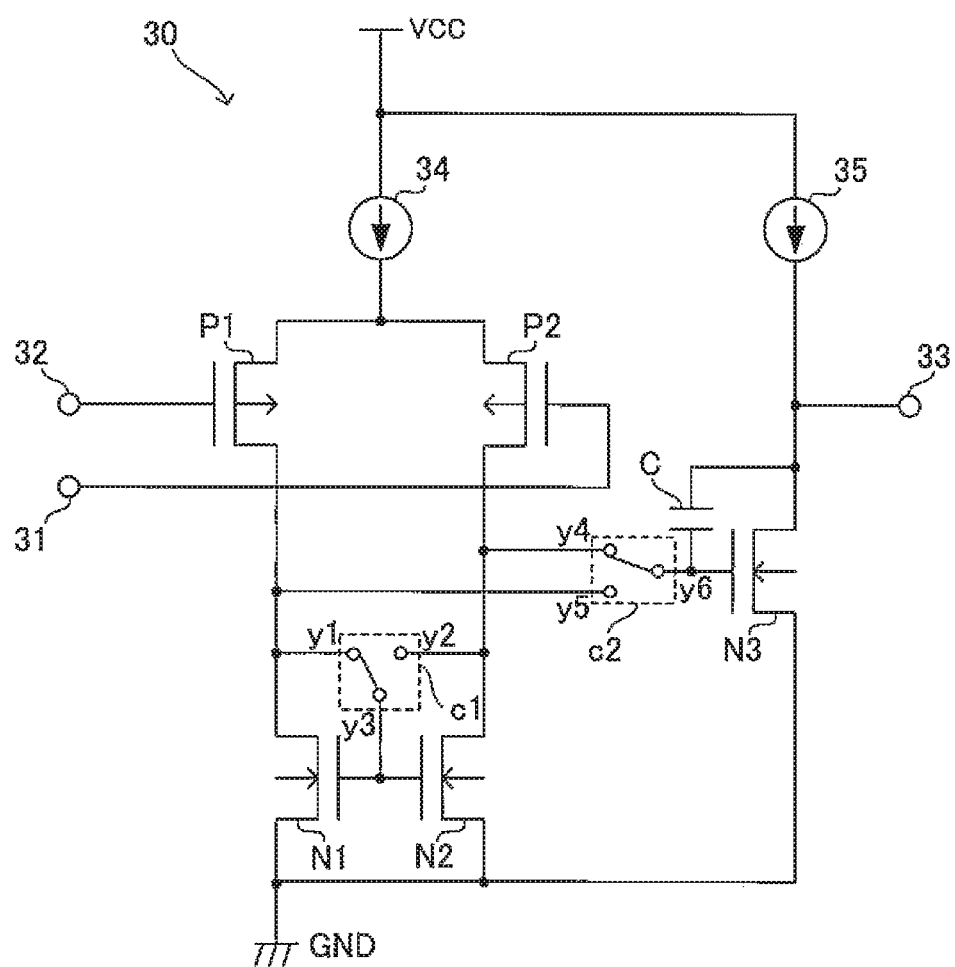
FIG. 2A is a circuit diagram showing an internal configuration of an operational amplifier according to an embodiment of the present invention.
Figure 2B:
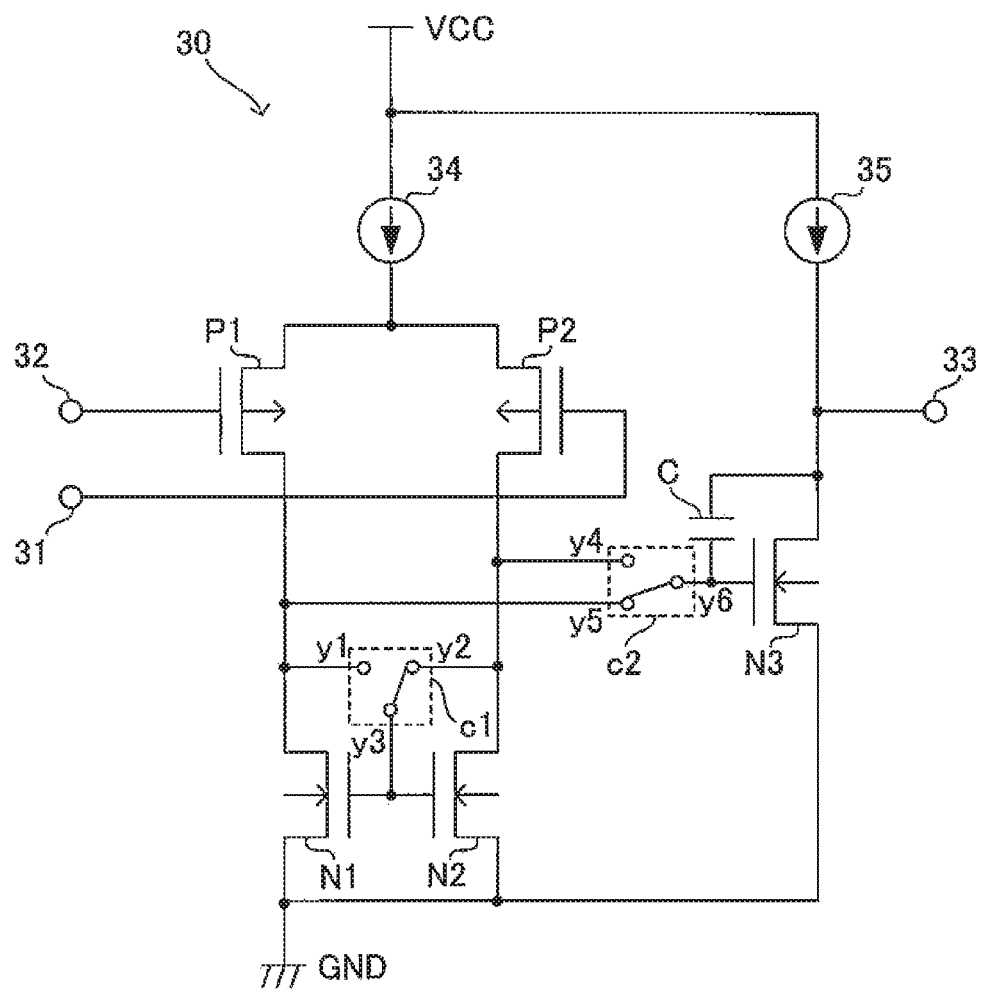
FIG. 2B is a circuit diagram showing an internal configuration of the operational amplifier according to the embodiment of the present invention.

FIGS. 2A and 2B show an example of an internal circuit configuration of the operational amplifier 30 constituting the analog level shifter. The operational amplifier 30 is configured such that the internal circuit connection can be switched by the switches c1 and c2. FIG. 2A shows a case where a first circuit connection is formed, and FIG. 2B shows a case where a second circuit connection is formed. In the operational amplifier 30, the first circuit connection or the second circuit connection is formed on the basis of a control signal SS3 supplied by the control unit 60.

The operational amplifier 30 includes current sources 34 and 35, P-channel MOS transistors P1 and P2 (hereinafter referred to simply as transistors P1 and P2), N-channel MOS transistors N1, N2, and N3 (hereinafter referred to simply as transistors N1, N2, and N3), a capacitor C for phase compensation, and switches c1 and c2.

One end of the current sources 34 and 35 is connected to the power source potential VCC. The sources of the transistors P1 and P2 are connected to the other end of the current source 34. The gate of the transistor P2 is connected to the first input terminal 31, and the gate of the transistor P1 is connected to the second input terminal 32. The drain of the transistor P1 is connected to the drain of the transistor N1, and the drain of the transistor P2 is connected to the drain of the transistor N2. The sources of the transistors N1 and N2 are both connected to ground potential. The gates of the transistors N1 and N2 are connected to each other. The drain of the transistor N3 is connected to the other end of the current source 35 and to the output terminal 33, while the source thereof is connected to ground potential. One end of the capacitor C for phase compensation is connected to the drain of the transistor N3, while the other end thereof is connected to the gate of the transistor N3.

The switch c1 has terminals y1, y2, and y3. The terminal y1 is connected to the drain of the transistor P1 and the drain of the transistor N1, the terminal y2 is connected to the drain of the transistor P2 and the drain of the transistor N2, and the terminal y3 is connected to the gate of the transistor N1 and the gate of the transistor N2. The switch c1 can be switched to a state whereby the terminal y3 is connected to the terminal y1 or to a state whereby the terminal y3 is connected to the terminal y2. The switching of the switch c1 is performed on the basis of the control signal SS3 supplied by the control unit 60.

The switch c2 has terminals y4, y5, and y6. The terminal y4 is connected to the drain of the transistor P2 and the drain of the transistor N2, the terminal y5 is connected to the drain of the transistor P1 and the drain of the transistor N1, and the terminal y6 is connected to the gate of the transistor N3. The switch c2 can be switched to a state whereby the terminal y6 is connected to the terminal y4 or to a state whereby the terminal y6 is connected to the terminal y5. The switching of the switch c2 is performed on the basis of the control signal SS3 supplied by the control unit 60.

FIG. 2A shows a case in which the first circuit connection is formed in the operational amplifier 30 by the switch c1 causing the terminal y3 to be connected to the terminal y1, and by switch c2 causing the terminal y6 to be connected to the terminal y4. In the operational amplifier 30 in which the first circuit connection is formed, if the voltage inputted to the first input terminal 31 is greater than the voltage inputted to the second input terminal 32, then the difference voltage Vout based on the difference in these voltages can be outputted from the output terminal 33.

FIG. 2B shows a case in which the second circuit connection is formed in the operational amplifier 30 by the switch c1 causing the terminal y3 to be connected to the terminal y2, and by switch c2 causing the terminal y6 to be connected to the terminal y5. In the operational amplifier 30 in which the second circuit connection is formed, if the voltage inputted to the second input terminal 32 is greater than the voltage inputted to the first input terminal 31, then the difference voltage Vout based on the difference in these voltages can be outputted from the output terminal 33.

When measuring the cell voltages of the battery cells s1 to s12 constituting the battery assembly 200, the control unit 60 controls the switches a1 to a26 of the battery cell selection circuit 10, the switches b1 to b4 of the input voltage switching circuit 20, and the switches c1 and c2 inside the operational amplifier 30.

FIG. 3 shows a measurement method for cell voltage according to an embodiment of the present invention, and is a timing chart showing an example of the progression of states of the switches a1 to a26, b1 to b4, c1, and c2, operating on the basis of the control signals SS1 to SS3 supplied by the control unit 60.

In the present embodiment, measurement of the cell voltage is performed starting with the lowest order battery cell s1, after which the cell voltage of the next order battery cell is measured, and the cell voltage of the highest order battery cell s12 is measured last.

The control unit 60 sets the switches a1 and a4 constituting the battery cell selection circuit 10 to be on at time t1, and sets the other switches constituting the battery cell selection circuit 10 to be off. As a result, the voltage V0 of the cathode of the battery cell s1 is outputted to the node n2 and the voltage V1 of the anode of the battery cell s1 is outputted to the node n1, causing the battery cell s1 to be selected for measurement of the cell voltage.

Also, the control unit 60 sets the switches b1 and b4 constituting the input voltage switching circuit 20 to be on at time t1, and sets the switches b2 and b3 to be off. In this manner, the voltage V0 of the cathode of the battery cell s1 is inputted to the second input terminal 32 of the operational amplifier 30, and the voltage V1 of the anode of the battery cell s1 is inputted to the first input terminal 31 of the operational amplifier 30.

Also, at time t1, the control unit 60 controls the switches c1 and c2 inside the operational amplifier 30 so as to form the first circuit connection shown in FIG. 2A. That is, the control unit 60 controls the switch c1 such that the terminal y1 is connected to the terminal y3, and the switch c2 such that the terminal y4 is connected to the terminal y6.

By the switches being controlled in this manner, the operational amplifier 30 outputs from the output terminal 33 the difference between the voltage V1 of the anode of the battery cell s1 and the voltage V0 of the cathode of the battery cell s1, that is, the difference voltage Vout corresponding to the cell voltage of the battery cell s1. However, an offset voltage Vof resulting from variations in the elements constituting the operational amplifier 30, fluctuations in the power source or temperature, or the like is added to the difference between the voltage V1 and the voltage V0. That is, the difference voltage Vout corresponding to the battery cell s1 outputted from the operational amplifier 30 under the above-mentioned states of the switches is represented by the following formula (1):

$$V\text{out} = V1 - V0 + V\text{of} \tag{1}$$

The control unit 60 causes the A/D converter 40 to convert the difference voltage Vout represented by formula (1) above to the digital data Sd when the difference voltage Vout stabilizes. The control unit 60 stores the digital data Sd supplied by the A/D converter 40 to a register (not shown) included in the control unit 60.

As described above, the voltage of the anode of the battery cell for which the cell voltage is to be measured is inputted to the first input terminal 31 of the operational amplifier 30, and the voltage of the cathode of the battery cell for which the cell voltage is to be measured is inputted to the second input terminal 32 of the operational amplifier 30. The measurement of the cell voltage in the operational amplifier 30 performed under the first circuit connection shown in FIG. 2A is referred to in the present specification as "forward direction measurement".

The control unit 60 maintains the states of the switches constituting the battery cell selection circuit 10 at time t2. In other words, the switches a1 and a4 remain on and the other switches constituting the battery cell selection circuit 10 remain off. Thus, the voltage V0 of the cathode of the battery cell s1 continues to be outputted to the node n2 and the voltage V1 of the anode of the battery cell s1 continues to be outputted to the node n1.

Also, the control unit 60 sets the switches b2 and b3 constituting the input voltage switching circuit 20 to be on at time t2, and sets the switches b1 and b4 to be off. In this manner, the voltage V1 of the anode of the battery cell s1 is inputted to the second input terminal 32 of the operational amplifier 30, and the voltage V0 of the cathode of the battery cell s1 is inputted to the first input terminal 31 of the operational amplifier 30.

Also, at time t2, the control unit 60 controls the switches c1 and c2 inside the operational amplifier 30 so as to form the second circuit connection shown in FIG. 2B. That is, the control unit 60 controls the switch c1 such that the terminal y2 is connected to the terminal y3, and the switch c2 such that the terminal y5 is connected to the terminal y6.

By controlling the switches in this manner, the operational amplifier 30 outputs from the output terminal 33 the difference between the voltage V1 of the anode of the battery cell s1 and the voltage V0 of the cathode of the battery cell s1, that is, the difference voltage Vout corresponding to the cell voltage of the battery cell s1. However, an offset voltage Vof resulting from variations in the elements constituting the operational amplifier 30, fluctuations in the power source or temperature, or the like is added to the difference between the voltage V1 and the voltage V0. That is, the difference voltage Vout corresponding to the battery cell s1 outputted from the operational amplifier 30 under the above-mentioned states of the switches is represented by the following formula (2):

$$V\text{out} = V1 - V0 - V\text{of} \tag{2}$$

The control unit 60 causes the A/D converter 40 to convert the difference voltage Vout represented by formula (2) above to the digital data Sd when the difference voltage Vout stabilizes. The control unit 60 stores the digital data Sd supplied by the A/D converter 40 to a register (not shown) included in the control unit 60.

As described above, the voltage of the cathode of the battery cell for which the cell voltage is to be measured is inputted to the first input terminal 31 of the operational amplifier 30, and the voltage of the anode of the battery cell for which the cell voltage is to be measured is inputted to the second input terminal 32 of the operational amplifier 30. The measurement of the cell voltage in the operational amplifier 30 performed under the second circuit connection shown in FIG. 2B is referred to in the present specification as "reverse direction measurement".

The control unit 60 calculates, as the measurement value for the cell voltage of the battery cell s1, the average of the digital data Sd corresponding to the difference voltage Vout indicated in formula (1) acquired by forward direction measurement and the digital data Sd corresponding to the difference voltage Vout indicated in formula (2) acquired by reverse direction measurement. As described above, it is possible to acquire the measurement value for the cell voltage without including the offset voltage Vof, by calculating the average of the digital data Sd corresponding to the difference voltage Vout acquired by forward direction measurement and the digital data Sd corresponding to the difference voltage Vout acquired by reverse direction measurement. The control operation by the control unit 60, which causes the difference voltage Vout acquired by forward direction measurement and the difference voltage Vout acquired by reverse direction measurement to be outputted successively from the output terminal 33 of the operational amplifier 30 by controlling the switches to be on/off, as described above, is referred to in the present specification as "cell voltage measurement control".

As described above, in the present embodiment, the control unit 60 performs the first measurement (shown in "FIRST" in FIG. 3) of the cell voltage of the battery cell s1 by forward direction measurement, and the second measurement (shown in "SECOND" in FIG. 3) of the cell voltage of the battery cell s1 by reverse direction measurement.

Here, when performing forward direction measurement for the battery cell s1 for which the cell voltage is to be measured first, a certain amount of time is required until the difference voltage Vout outputted from the operational amplifier 30 stabilizes, and the measurement time for when forward direction measurement is to be performed for the battery cell s1 is T. Also, when performing reverse direction measurement for the battery cell s1, the operational amplifier 30 is switched from the first circuit connection shown in FIG. 2A to the second circuit connection shown in FIG. 2B. As a result, a certain amount of time is required until the difference voltage Vout outputted from the operational amplifier 30 stabilizes, and the measurement time for when reverse direction measurement is to be performed for the battery cell s1 is T, which is the same as during forward direction measurement.

When measurement of the cell voltage of the battery cell s1 by forward direction measurement and reverse direction measurement is completed, the control unit 60 selects the battery cell s2 for which the cell voltage is to be measured at time t3. The control unit 60 performs the first measurement of the cell voltage of the battery cell s2 by reverse direction measurement, which is the same type of measurement as the second measurement for the battery cell s1.

That is, the control unit 60 sets the switches a3 and a6 constituting the battery cell selection circuit 10 to be on at time t3, and sets the other switches constituting the battery cell selection circuit 10 off. As a result, the voltage V1 of the cathode of the battery cell s2 is outputted to the node n2 and the voltage V2 of the anode of the battery cell s2 is outputted to the node n1, causing the battery cell s2 to be selected for measurement of the cell voltage.

Also, the control unit 60 maintains the state in which the switches b2 and b3 constituting the input voltage switching circuit 20 are on at time t3, while maintaining the state in which the switches b1 and b4 are off. In this manner, the voltage V2 of the anode of the battery cell s2 is inputted to the second input terminal 32 of the operational amplifier 30, and the voltage V1 of the cathode of the battery cell s2 is inputted to the first input terminal 31 of the operational amplifier 30.

Also, at time t3, the control unit 60 maintains the state in which the second circuit connection shown in FIG. 2B is formed. That is, inside the operational amplifier 30, the state in which the terminal y2 and the terminal y3 of the switch c1 are connected, and the terminal y5 and the terminal y6 of the switch c2 are connected.

By controlling the switches in this manner, the operational amplifier 30 outputs from the output terminal 33 the difference between the voltage V2 of the anode of the battery cell s2 and the voltage V1 of the cathode of the battery cell s2, that is, the difference voltage Vout corresponding to the cell voltage of the battery cell s2. However, an offset voltage Vof resulting from variations in the elements constituting the operational amplifier 30, fluctuations in the power source or temperature, or the like is added to the difference between the voltage V2 and the voltage V1. That is, the difference voltage Vout corresponding to the battery cell s2 outputted from the operational amplifier 30 under the above-mentioned states of the switches is represented by the following formula (3):

$$Vout=V2-V1-Vof \quad (3)$$

The control unit 60 causes the A/D converter 40 to convert the difference voltage Vout represented by formula (3) above to the digital data Sd when the difference voltage Vout stabilizes. The control unit 60 stores the digital data Sd supplied by the A/D converter 40 to a register (not shown) included in the control unit 60.

When the first measurement for the battery cell s2 by reverse direction measurement is completed, the control unit 60 performs the second measurement for the battery cell s2 by forward direction measurement.

The control unit 60 maintains the states of the switches constituting the battery cell selection circuit 10 at time t4. In other words, the switches a3 and a6 remain on and the other switches constituting the battery cell selection circuit 10 remain off. Thus, the voltage V1 of the cathode of the battery cell s2 continues to be outputted to the node n2 and the voltage V2 of the anode of the battery cell s2 continues to be outputted to the node n1.

Also, the control unit 60 sets the switches b1 and b4 constituting the input voltage switching circuit 20 to be on at time t4, and sets the switches b2 and b3 to be off. In this manner, the voltage V2 of the anode of the battery cell s2 is inputted to the first input terminal 31 of the operational amplifier 30, and the voltage V1 of the cathode of the battery cell s2 is inputted to the second input terminal 32 of the operational amplifier 30.

Also, at time t4, the control unit 60 controls the switches c1 and c2 inside the operational amplifier 30 so as to form the first circuit connection shown in FIG. 2A. That is, the control unit 60 controls the switch c1 such that the terminal y1 is connected to the terminal y3, and the switch c2 such that the terminal y4 is connected to the terminal y6.

By controlling the switches in this manner, the operational amplifier 30 outputs from the output terminal 33 the difference between the voltage V2 of the anode of the battery cell s2 and the voltage V1 of the cathode of the battery cell s2, that is, the difference voltage Vout corresponding to the cell voltage of the battery cell s2. However, an offset voltage Vof resulting from variations in the elements constituting the operational amplifier 30, fluctuations in the power source or temperature, or the like is added to the difference between the voltage V2 and the voltage V1. That is, the difference voltage Vout corresponding to the battery cell s2 outputted from the operational amplifier 30 under the above-mentioned states of the switches is represented by the following formula (4):

$$Vout = V2 - V1 + Vof \quad (4)$$

The control unit 60 calculates, as the measurement value for the cell voltage of the battery cell s2, the average of the digital data Sd corresponding to the difference voltage Vout indicated in formula (3) acquired by reverse direction measurement and the digital data Sd corresponding to the difference voltage Vout indicated in formula (4) acquired by forward direction measurement. As described above, it is possible to acquire the measurement value for the cell voltage without including the offset voltage Vof, by calculating the average of the digital data Sd corresponding to the difference voltage Vout acquired by forward direction measurement and the digital data corresponding to the difference voltage Vout acquired by reverse direction measurement.

Here, the first measurement of the cell voltage of the battery cell s2 is performed by reverse direction measurement, which is the same type of measurement as the second measurement for the battery cell s1. Thus, when progressing from the second measurement for the battery cell s1 to the first measurement for the battery cell s2, the internal circuit connection of the operational amplifier 30 need not be switched. As a result, the time required for stabilization of the difference voltage Vout outputted from the operational amplifier 30 during the first measurement for the battery cell s2 is shorter than the time required for stabilization of the difference voltage Vout during second measurement for the battery cell s1, which requires switching of the circuit connection of the operational amplifier 30. Therefore, the time required for the first measurement for the battery cell s2 is $T_1$ (<T), which is shorter than the time required for the second measurement for the battery cell s1. On the other hand, the second measurement of the battery cell s2 requires switching of the circuit connection of the operational amplifier 30, and thus, the time required for the second measurement for the battery cell s2 is T, which is the same as the time required for the second measurement for the battery cell s1.

When measurement of the cell voltage of the battery cell s2 by forward direction measurement and reverse direction measurement is completed, the control unit 60 selects the battery cell s3 for which the cell voltage is to be measured. The control unit 60 performs the first measurement of the cell voltage of the battery cell s3 by the same forward direction measurement as the second measurement for the battery cell s2, and performs the second measurement of the cell voltage of the battery cell s3 by reverse direction measurement. Thus, when progressing from the second measurement for the battery cell s2 to the first measurement for the battery cell s3, the internal circuit connection of the operational amplifier 30 need not be switched. As a result, the time required for stabilization of the difference voltage Vout outputted from the operational amplifier 30 during the first measurement for the battery cell s3 is shorter than the time required for stabilization of the difference voltage Vout during second measurement for the battery cell s1, which requires switching of the circuit connection of the operational amplifier 30. Therefore, the time required for the first measurement for the battery cell s3 is $T_1$ (<T), which is shorter than the time required for the second measurement for the battery cell s1. On the other hand, the second measurement of the battery cell s3 requires switching of the circuit connection of the operational amplifier 30, and thus, the time required for the second measurement for the battery cell s3 is T, which is the same as the time required for the second measurement for the battery cell s1.

Thereafter, forward direction measurement and reverse direction measurement of cell voltages are performed in a similar manner in the rest of the battery cells. The first measurement of the cell voltage of each battery cell is performed in the same measurement state as the second cell voltage measurement for another battery cell for which the cell voltage was measured immediately prior thereto. In other words, if the second measurement of the battery cell for which the cell voltage was measured immediately prior to the current battery cell was performed by forward direction measurement, the first measurement of the cell voltage of the following battery cell is performed by forward direction measurement. On the other hand, if the second measurement of the battery cell for which the cell voltage was measured immediately prior to the current battery cell was performed by reverse direction measurement, the first measurement of the cell voltage of the following battery cell is performed by reverse direction measurement.

By measuring the cell voltage by forward direction measurement and reverse direction measurement for each of the battery cells s1 to s12 by the above method, it is possible to have $T_1$, which is shorter than T, as the first measurement time for the battery cells s2 to s12. Therefore, according to the semiconductor device 100 of the present embodiment, the total time required to complete measurement of the cell voltages for all battery cells s1 to s12 is $13T+11T_1$.

Figure 4:
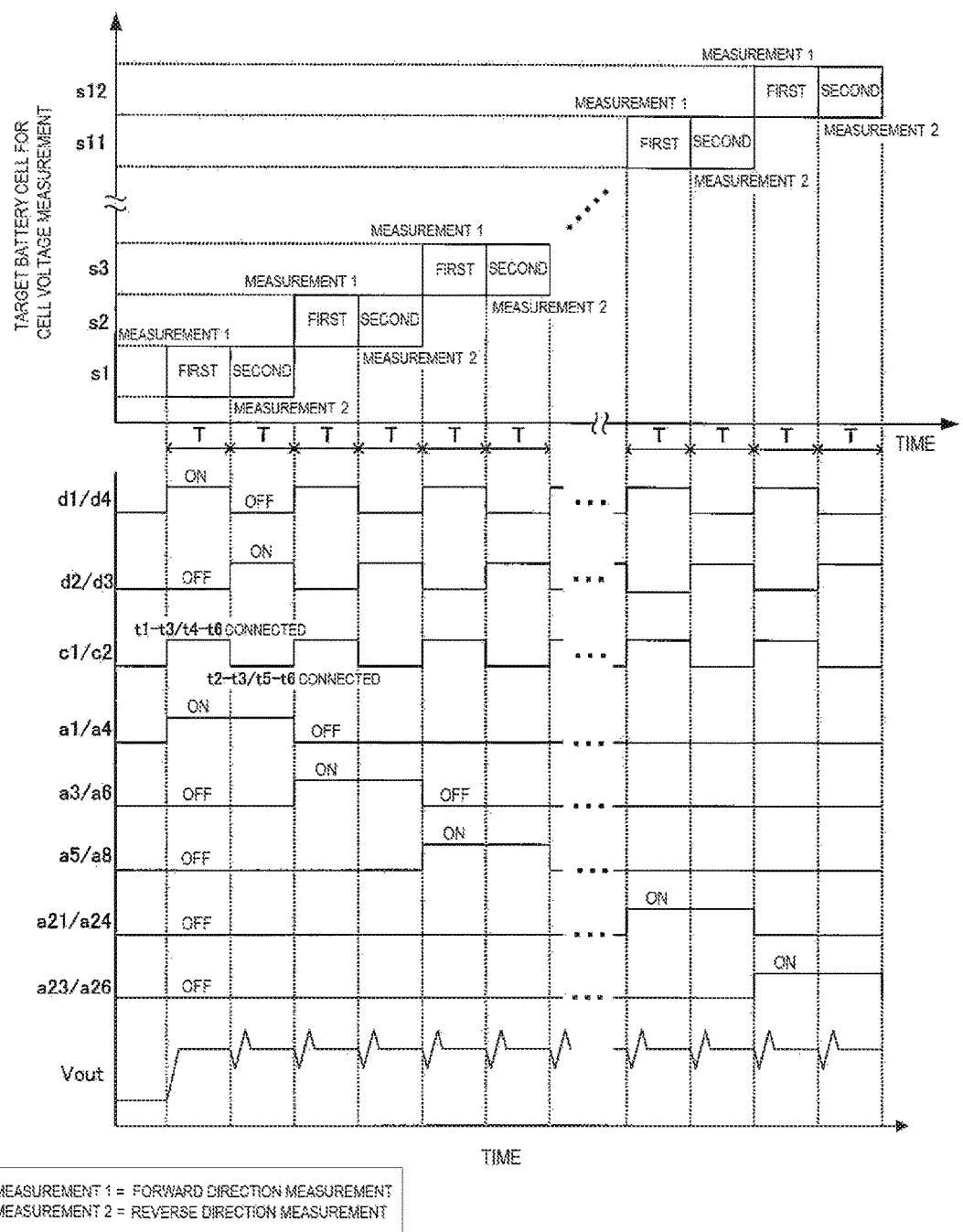
FIG. 4 is a timing chart showing a measurement method for cell voltage according to a comparison example.

FIG. 4 shows a measurement method for cell voltage according to a comparison example, and is a timing chart showing an example of the progression of states of the switches a1 to a26, and switches b1 to b4, c1, and c2 of the input voltage switching circuit 20, operating on the basis of the control signals SS1 to SS3 supplied by the control unit 60.

In the measurement method for cell voltage of the comparison example, the first measurement of the cell voltage of each battery cell is always performed by forward direction measurement, and the second measurement of cell voltage of each battery cell is always performed by reverse direction measurement. In other words, the forward direction measurement and reverse direction measurement are performed alternately. According to this aspect, the first measurement for each battery cell is always performed in a differing measurement state from the second measurement for another battery cell for which the cell voltage was measured immediately prior thereto.

Thus, the internal circuit connection of the operational amplifier 30 also needs to be switched when progressing from the second measurement of the cell voltage of the battery cell immediately prior, to the first measurement for the battery cell for which the cell voltage is to be measured next. If the internal circuit connection of the operational amplifier 30 needs to be switched, a certain amount of time is required for the difference voltage Vout to stabilize, and the time required for measurement of the cell voltage when switching the internal circuit connection of the operational amplifier 30 is T. Therefore, according to the measurement method for cell voltage of the comparison example, the time required for both the first and second measurements for each of the battery cells is T, and the total time required to complete measurement of the cell voltages for all battery cells s1 to s12 is 24T.

By contrast, according to the measurement method for cell voltage implemented by the semiconductor device 100 of an embodiment of the present invention, it is possible to reduce the number of times the circuit connection of the operational amplifier 30 is switched, and the total time required to complete measurement of the cell voltages for all battery cells s1 to s12 is, as described above, $13T+11T_1$. If, for example, it is possible to have $T_1$ be approximately 50% of T, then according to the measurement method for cell voltage according to the embodiment of the present invention, the time required until completion of measurement of the cell voltages for all battery cells s1 to s12 can be shortened to approximately 75% compared to the measurement method for cell voltage of the comparison example.

Also, according to the measurement method for cell voltage implemented by the semiconductor device 100 of an embodiment of the present invention, forward direction measurement and reverse direction measurement are successively performed for each battery cell, and thus, the same amount of time can be taken to acquire the measurement value for the cell voltages through forward direction measurement and reverse direction measurement. In this manner, it is possible to improve measurement accuracy for the cell voltage compared to a case in which there is a relatively long period of time between forward direction measurement and reverse direction measurement for each battery cell.

Embodiment 2

Figure 5:
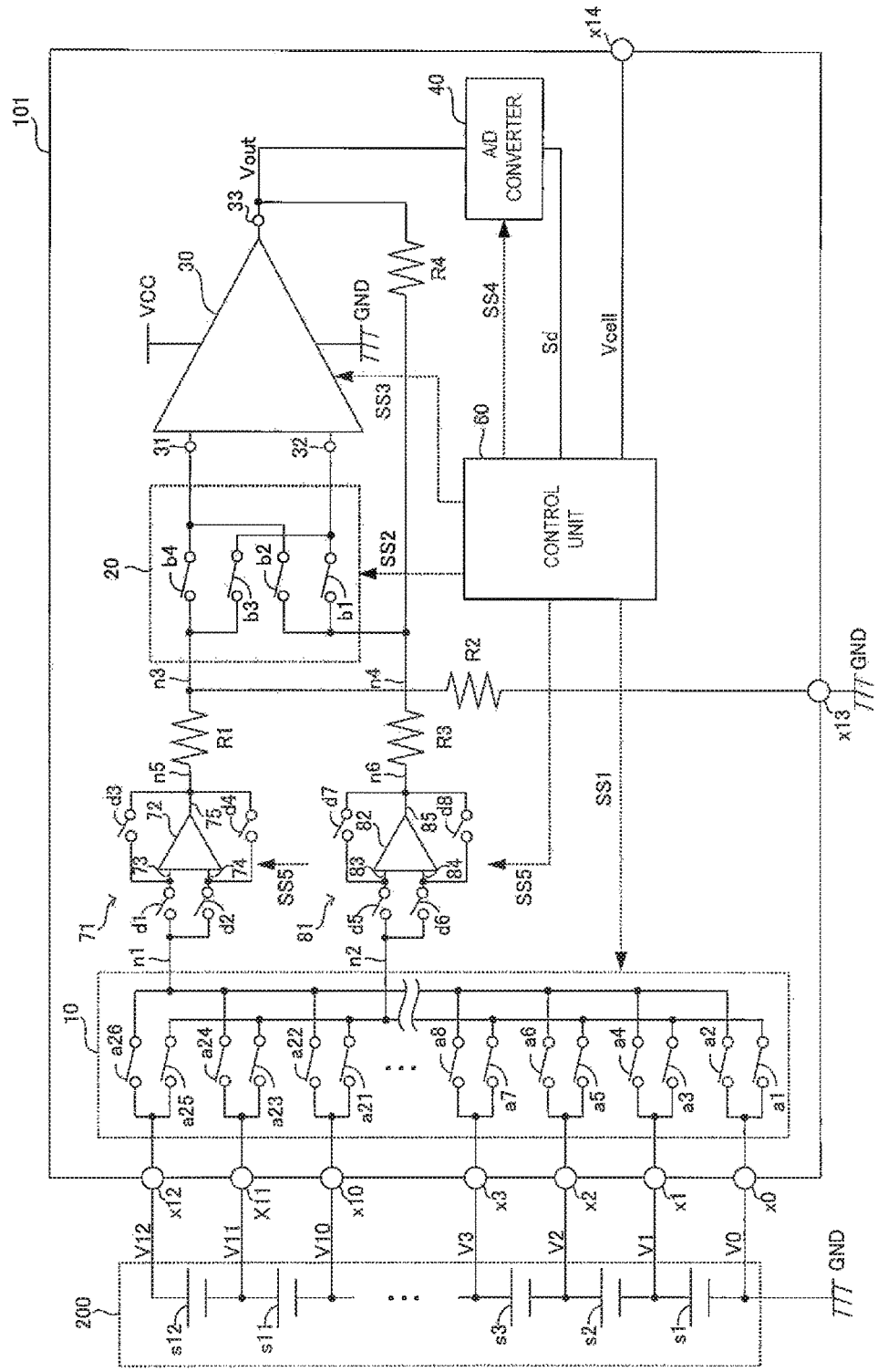
FIG. 5 is a circuit block diagram showing a semiconductor device according to another embodiment of the present invention.

FIG. 5 is a circuit block diagram showing a semiconductor device 101 according to Embodiment 2 of the present invention. The semiconductor device 101 differs from the semiconductor device 100 of Embodiment 1 above in that it additionally includes a first buffer circuit 71 and a second buffer circuit 81.

The first buffer circuit 71 includes an operational amplifier 72 and switches d1, d2, d3, and d4. The operational amplifier 72 has a first buffer input terminal 73, a second buffer input terminal 74, and a buffer output terminal 75. The switch d1 is provided between the node n1 and the first buffer input terminal 73, and the switch d2 is provided between the node n1 and the second buffer input terminal 74. The switch d3 is provided between the first buffer input terminal 73 and the buffer output terminal 75, and the switch d4 is provided between the second buffer input terminal 74 and the buffer output terminal 75. The switches d1 to d4 are turned on/off on the basis of a control signal SS5 supplied by the control unit 60.

The first buffer circuit 71 performs impedance conversion on a voltage outputted by the node n1, which is one output terminal of the battery cell selection circuit 10, and outputs the converted voltage to the node n5, which is one end of the resistor R1. The voltage outputted from the first buffer circuit 71 is inputted to the first input terminal 31 or the second input terminal 32 of the operational amplifier 30 constituting the analog level shifter, through the resistor R1 and the input voltage switching circuit 20.

As a result of the switches d1 and d4 being on and the switches d2 and d3 being off in the first buffer circuit 71, voltage from the battery cell is inputted to the first buffer input terminal 73, and the second buffer input terminal 74 can be set to a first state in which it is connected to the buffer output terminal 75. Also, as a result of the switches d2 and d3 being on and the switches d1 and d4 being off in the first buffer circuit 71, voltage from the battery cell is inputted to the second buffer input terminal 74, and the first buffer input terminal 73 can be set to a second state in which it is connected to the buffer output terminal 75.

Meanwhile, the second buffer circuit 81 has a similar configuration to the first buffer circuit 71. In other words, the second buffer circuit 81 includes an operational amplifier 82 and switches d5, d6, d7, and d8. The operational amplifier 82 has a first buffer input terminal 83, a second buffer input terminal 84, and a buffer output terminal 85. The switch d5 is provided between the node n2 and the first buffer input terminal 83, and the switch d6 is provided between the node n2 and the second buffer input terminal 84. The switch d7 is provided between the first buffer input terminal 83 and the buffer output terminal 85, and the switch d8 is provided between the second buffer input terminal 84 and the buffer output terminal 85. The switches d5 to d8 are turned on/off on the basis of a control signal SS5 supplied by the control unit 60.

The second buffer circuit 81 performs impedance conversion on a voltage outputted by the node n2, which is the other output terminal of the battery cell selection circuit 10, and outputs the converted voltage to the node n6, which is one end of the resistor R3. The voltage outputted from the second buffer circuit 81 is inputted to the first input terminal 31 or the second input terminal 32 of the operational amplifier 30 constituting the analog level shifter, through the resistor R3 and the input voltage switching circuit 20.

As a result of the switches d5 and d8 being on and the switches d6 and d7 being off in the second buffer circuit 81, cell voltage is inputted to the first buffer input terminal 83, and the second buffer input terminal 84 can be set to a first state in which it is connected to the buffer output terminal 85. Also, as a result of the switches d6 and d7 being on and the switches d5 and d8 being off in the second buffer circuit 81, cell voltage is inputted to the second buffer input terminal 84, and the first buffer input terminal 83 can be set to a second state in which it is connected to the buffer output terminal 85.

The internal configuration of the operational amplifier 72 constituting the first buffer circuit 71 and the operational amplifier 82 constituting the second buffer circuit 81 is the same as the operational amplifier 30 constituting the analog level shifter shown in FIGS. 2A and 2B. In the operational amplifiers 72 and 82, the first circuit connection shown in FIG. 2A or the second circuit connection shown in FIG. 2B is formed on the basis of a control signal SS5 supplied by the control unit 60.

Below, the measurement method for cell voltage in the semiconductor device 101 according to Embodiment 2 of the present invention will be described. In the present embodiment, the switching control operation for the switches a1 to a26 of the battery cell selection circuit 10, the switches b1 to b4 of the input voltage switching circuit 20, and the switches c1 and c2 inside the operational amplifier 30 constituting the analog level shifter, is similar to that of the semiconductor device 100 according to Embodiment 1 above. That is, cell voltage measurement by forward direction measurement and reverse direction measurement is performed for each battery cell, and the first measurement of the cell voltage of each battery cell is performed in the same measurement state as the second cell voltage measurement for another battery cell for which the cell voltage was measured immediately prior thereto.

Figure 6:
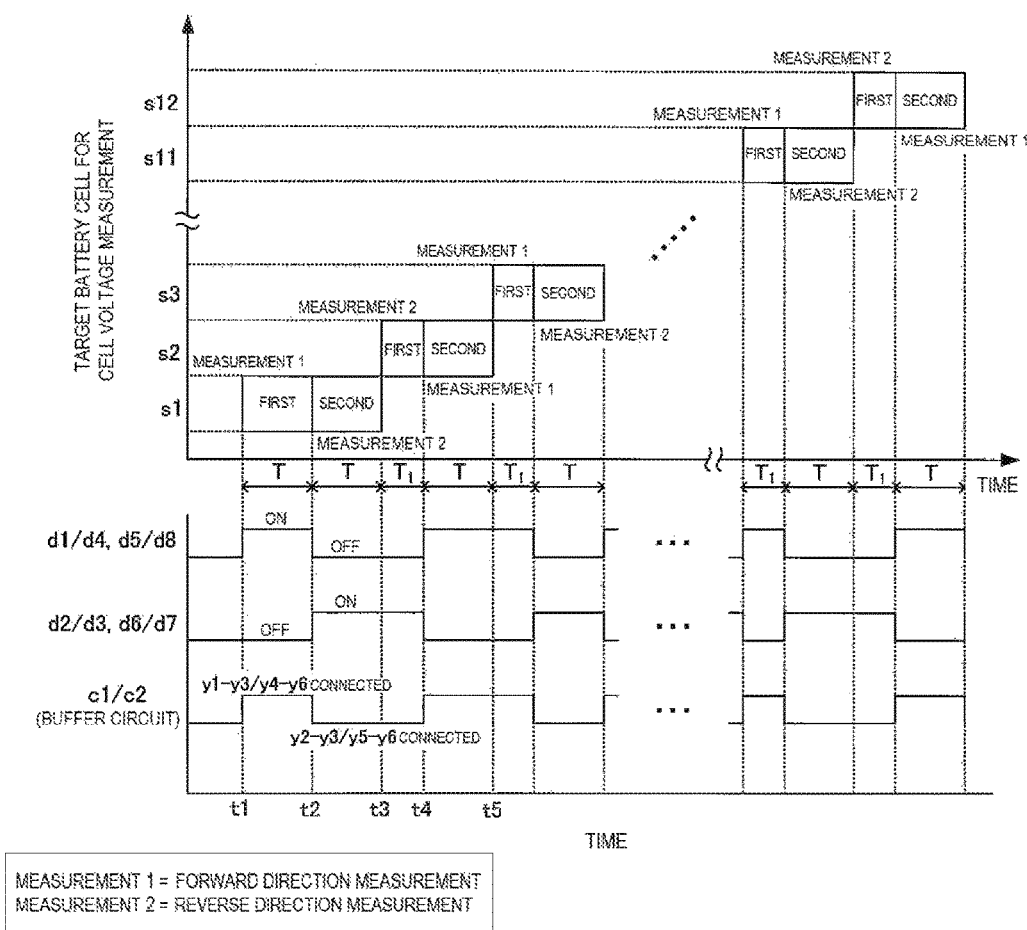
FIG. 6 is a timing chart showing a measurement method for cell voltage according to another embodiment of the present invention.

FIG. 6 shows an example of the progression of the state of the switches d1 to d4 constituting the first buffer circuit 71, the state of the switches c1 and c2 in the operational amplifier 72, the state of the switches d5 to d8 constituting the second buffer circuit 81, and the state of the switches c1 and c2 in the operational amplifier 82, when measuring the cell voltage of each battery cell.

During the period from time t1 to time t2 when forward direction measurement is performed on the battery cell s1, the control unit 60 turns on the switches d1 and d4 constituting the first buffer circuit 71, and turns off the switches d2 and d3. Also, the control unit 60 turns on the switches d5 and d8 constituting the second buffer circuit 81, and turns off the switches d6 and d7. Also, during the period from time t1 to time t2, the control unit 60 controls the switches c1 and c2 inside the operational amplifiers 72 and 82 so as to form the first circuit connection shown in FIG. 2A. That is, the control unit 60 controls the switch c1 such that the terminal y1 is connected to the terminal y3, and the switch c2 such that the terminal y4 is connected to the terminal y6. By controlling the switches of the first buffer circuit 71 and the second buffer circuit 81 in the manner described above, the first state is formed in the first buffer circuit 71 and the second buffer circuit 81. Additionally, an impedance conversion process is performed on the inputted voltage from the battery cells, in the first buffer circuit 71 and the second buffer circuit 81.

During the period from time t2 to time t3 when reverse direction measurement is performed on the battery cell s1, the control unit 60 turns off the switches d1 and d4 constituting the first buffer circuit 71, and turns on the switches d2 and d3. Also, the control unit 60 turns off the switches d5 and d8 constituting the second buffer circuit 81, and turns on the switches d6 and d7. Also, during the period from time t2 to time t3, the control unit 60 controls the switches c1 and c2 inside the operational amplifiers 72 and 82 so as to form the second circuit connection shown in FIG. 2B. That is, the control unit 60 controls the switch c1 such that the terminal y2 is connected to the terminal y3, and the switch c2 such that the terminal y5 is connected to the terminal y6. By controlling the switches of the first buffer circuit 71 and the second buffer circuit 81 in the manner described above, the second state is formed in the first buffer circuit 71 and the second buffer circuit 81. Additionally, an impedance conversion process is performed on the inputted voltage from the battery cells, in the first buffer circuit 71 and the second buffer circuit 81.

During the period from time t3 to time t4 when reverse direction measurement is performed on the battery cell s2, the control unit 60 maintains the same state as when reverse direction measurement was performed on the battery cell s1 for the switches in the first buffer circuit 71 and the second buffer circuit 81. In other words, the first state is maintained in the first buffer circuit 71 and the second buffer circuit 81.

During the period from time t4 to time t5 when forward direction measurement is performed on the battery cell s2, the control unit 60 switches the state of the switches in the first buffer circuit 71 and the second buffer circuit 81 to the same state as when forward direction measurement was performed on the battery cell s1. In other words, in the first buffer circuit 71 and the second buffer circuit 81 the state is switched to the second state.

Similarly, when performing forward direction measurement for the battery cells, the control unit 60 sets the first buffer circuit 71 and the second buffer circuit 81 to be in the first state. In other words, a voltage from the battery cells is inputted to the first buffer input terminals 73 and 83, the second buffer input terminals 74 and 84 are connected to the buffer output terminals 75 and 85, and the first circuit connection shown in FIG. 2A is formed in the operational amplifiers 72 and 82. Also, when performing reverse direction measurement for the battery cells, the control unit 60 sets the first buffer circuit 71 and the second buffer circuit 81 to be in the second state. In other words, a voltage from the battery cells is inputted to the second buffer input terminals 74 and 84, the first buffer input terminals 73 and 83 are connected to the buffer output terminals 75 and 85, and the second circuit connection shown in FIG. 2B is formed in the operational amplifiers 72 and 82.

According to the semiconductor device 101 of the present embodiment, similar to the semiconductor device 100 of Embodiment 1, it is possible to shorten the measurement time for the cell voltage compared to the comparison example. According to the semiconductor device 101 of the present embodiment, it is possible to acquire a measurement value for cell voltage that does not include the offset voltage Vof for the battery cells s1 to s12. According to the semiconductor device 101 of the present embodiment, by switching the connections of the first buffer circuit 71 and the second buffer circuit 81 as described above when measuring the cell voltage twice for each battery cell, it is possible to prevent the offset voltage resulting from the first buffer circuit 71 and the second buffer circuit 81 from being added to the measurement value of the cell voltage.

In the present embodiment, the switching of states of the first buffer circuit 71 and the second buffer circuit 81 corresponds with switching between forward direction measurement and reverse direction measurement, but the invention is not limited to this aspect. That is, it is possible to cancel out the offset voltage resulting from the first buffer circuit 71 and the second buffer circuit 81 by forming the first state during one measurement among the two measurements performed for each battery cell and forming the second state during the other measurement, in the first buffer circuit 71 and the second buffer circuit 81.

Embodiment 3

Figure 7:
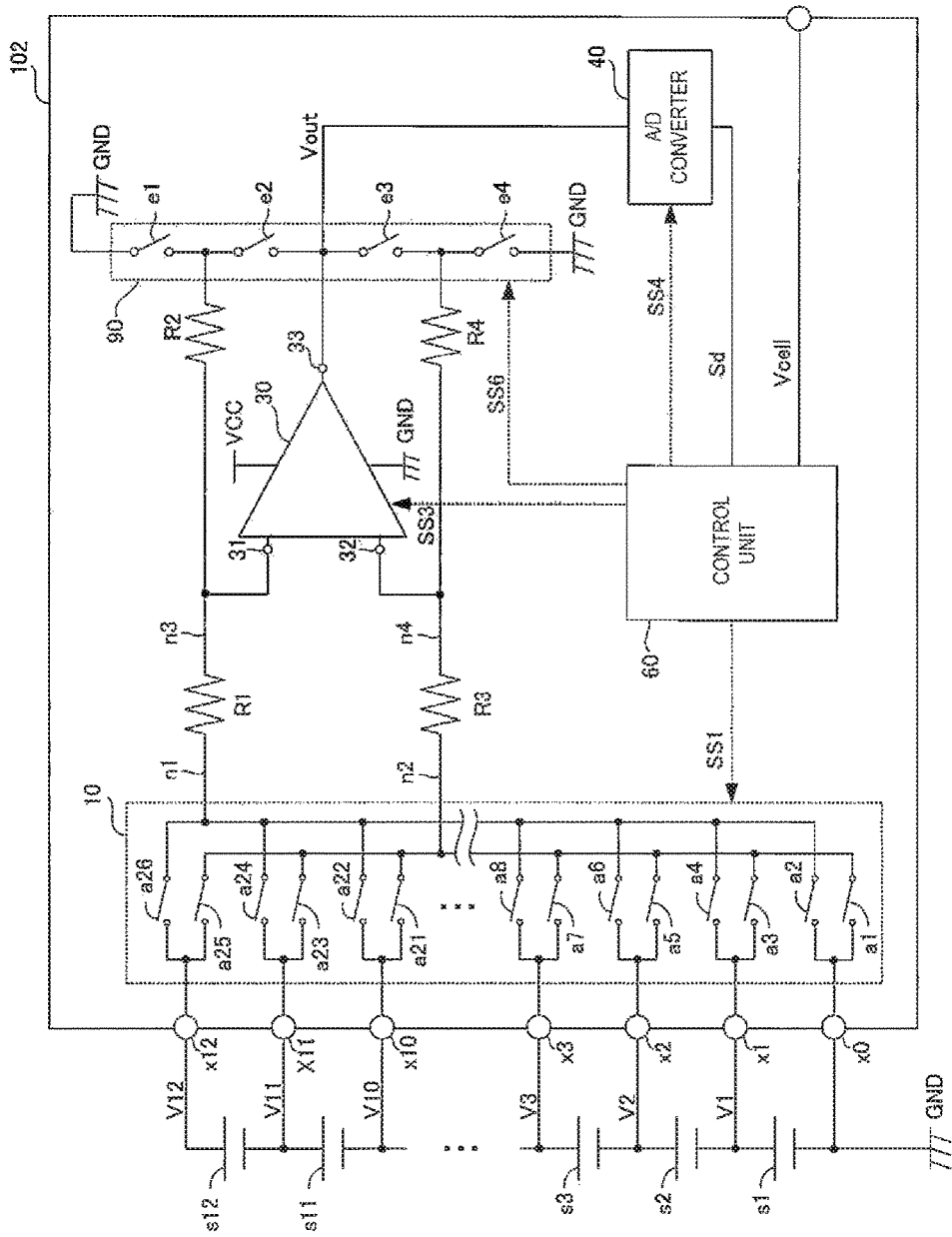
FIG. 7 is a circuit block diagram showing a semiconductor device according to another embodiment of the present invention.

FIG. 7 is a circuit block diagram showing a semiconductor device 102 according to Embodiment 3 of the present invention. The semiconductor device 102 differs from the semiconductor device 100 of Embodiment 1 in not having the input voltage switching circuit 20 but having a connection switching circuit 90.

The first input terminal 31 of the operational amplifier 30 constituting the analog level shifter is connected to a node n3, which is one end of a resistor R1, and the second input terminal 32 of the operational amplifier 30 is connected to a node n4, which is another end of a resistor R3.

The connection switching circuit 90 has switches e1, e2, e3, and e4. One end of the switch e1 is connected to a resistor R2, and the other end is connected to ground potential. One end of the switch e2 is connected to the resistor R2, and the other end is connected to the output terminal 33 of the operational amplifier 30. One end of the switch e3 is connected to the resistor R4, and the other end is connected to the output terminal 33 of the operational amplifier 30. One end of the switch e4 is connected to a resistor R4, and the other end is connected to ground potential. The switches e1 to e4 are turned on/off on the basis of a control signal SS6 supplied by the control unit 60.

Figure 8:
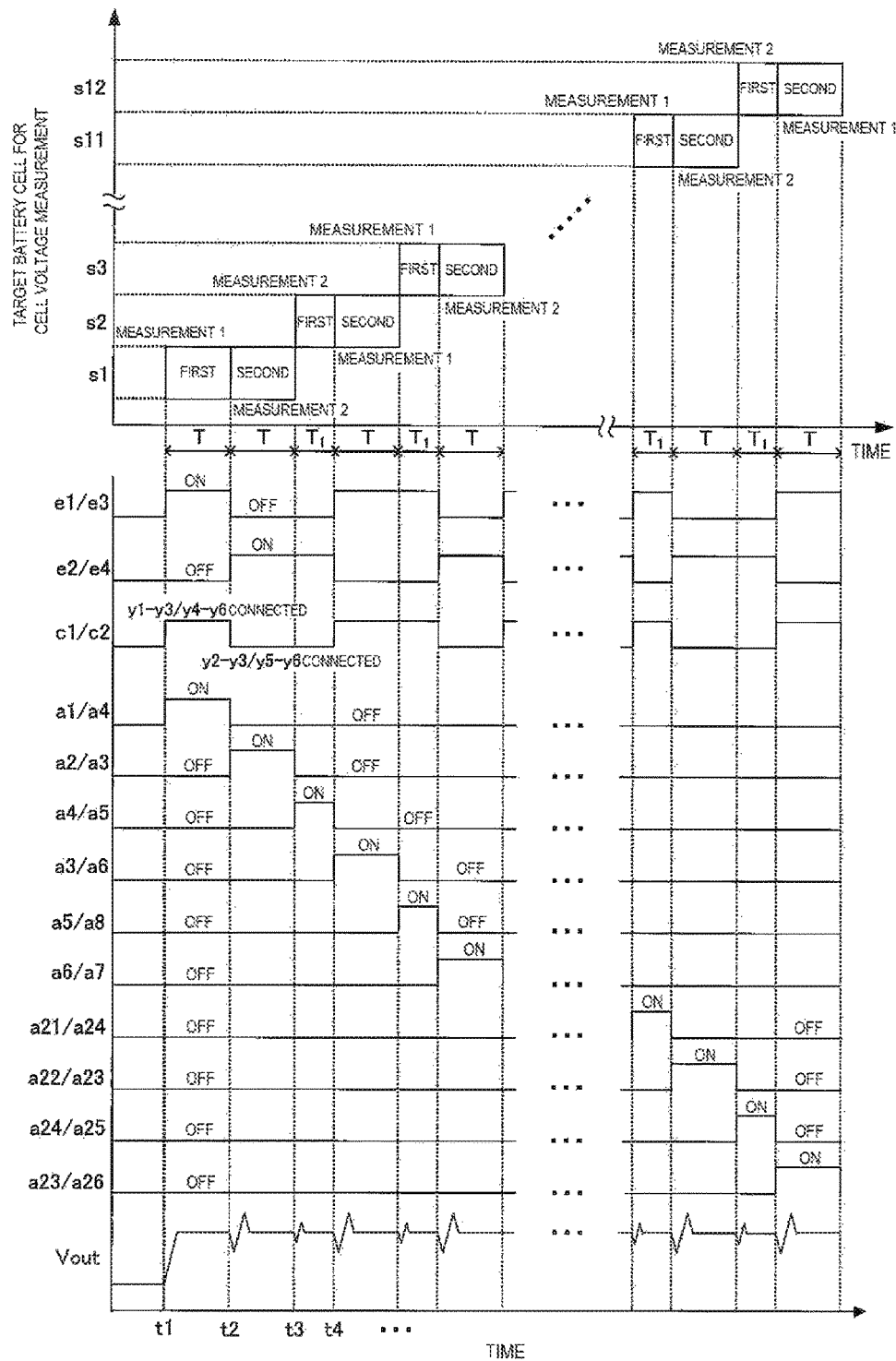
FIG. 8 is a timing chart showing a measurement method for cell voltage according to another embodiment of the present invention.

FIG. 8 shows a measurement method for cell voltage according to Embodiment 3 of the present invention, and is a timing chart showing an example of the progression of states of the switches a1 to a26 of the battery cell selection circuit 10, the switches c1 and c2 inside the operational amplifier 30, and the switches e1 to e4 of the connection switching circuit 90, which operate on the basis of the control signals supplied by the control unit 60.

Similar to the semiconductor device 100 of Embodiment 1, in the semiconductor device 102 of the present embodiment, cell voltage measurement by forward direction measurement and reverse direction measurement is performed for each battery cell, and the first measurement of the cell voltage of each battery cell is performed in the same measurement state as the second cell voltage measurement for another battery cell for which the cell voltage was measured immediately prior thereto.

If forward direction measurement is to be performed on the battery cell s1, the control unit 60 sets the switches a1 and a4, among the switches a1 to a26 constituting the battery cell selection circuit 10, to be on, and sets the other switches to be off. Also, the control unit 60 turns on the switches e1 and e3, among the switches e1 to e4 constituting the connection switching circuit 90, and turns off the switches e2 and e4. Additionally, the control unit 60 controls the switches c1 and c2 inside the operational amplifier 30 so as to form the first circuit connection shown in FIG. 2A. That is, the control unit 60 controls the switch c1 such that the terminal y1 is connected to the terminal y3, and the switch c2 such that the terminal y4 is connected to the terminal y6. By controlling the switches as described above, the control unit 60 acquires digital data Sd corresponding to the difference voltage Vout for the battery cell s1 by forward direction measurement.

After performing forward direction measurement for the battery cell s1, reverse direction measurement is performed on the battery cell s1. If reverse direction measurement is to be performed on the battery cell s1, the control unit 60 sets the switches a2 and a3, among the switches a1 to a26 constituting the battery cell selection circuit 10, to be on, and sets the other switches to be off. Also, the control unit 60 turns on the switches e2 and e4, among the switches e1 to e4 constituting the connection switching circuit 90, and turns off the switches e1 and e3. Additionally, the control unit 60 controls the switches c1 and c2 inside the operational amplifier 30 so as to form the second circuit connection shown in FIG. 2B. That is, the control unit 60 controls the switch c1 such that the terminal y2 is connected to the terminal y3, and the switch c2 such that the terminal y5 is connected to the terminal y6. By controlling the switches as described above, the control unit 60 acquires digital data Sd corresponding to the difference voltage Vout for the battery cell s1 by reverse direction measurement.

The control unit 60 calculates, as the measurement value for the cell voltage of the battery cell s1, the average of the digital data Sd corresponding to the difference voltage Vout indicated in formula (1) acquired by forward direction measurement and the digital data Sd corresponding to the difference voltage Vout indicated in formula (2) acquired by reverse direction measurement.

After performing reverse direction measurement for the battery cell s1, reverse direction measurement is performed on the battery cell s2. If reverse direction measurement is to be performed on the battery cell s2, the control unit 60 sets the switches a4 and a5, among the switches a1 to a26 constituting the battery cell selection circuit 10, to be on, and sets the other switches to be off. Also, the control unit 60 keeps on the switches e2 and e4 constituting the connection switching circuit 90, and keeps off the switches e1 and e3. Additionally, in the operational amplifier 30, the control unit 60 maintains the state in which the second circuit connection shown in FIG. 2B is formed. That is, the control unit 60 continues to control the switch c1 such that the terminal y2 is connected to the terminal y3, and the switch c2 such that the terminal y5 is connected to the terminal y6. By controlling the switches as described above, the control unit 60 acquires digital data Sd corresponding to the difference voltage Vout for the battery cell s2 by reverse direction measurement.

After performing reverse direction measurement for the battery cell s2, forward direction measurement is performed on the battery cell s2. If forward direction measurement is to be performed on the battery cell s2, the control unit 60 sets the switches a3 and a6, among the switches a1 to a26 constituting the battery cell selection circuit 10, to be on, and sets the other switches off. Also, the control unit 60 turns on the switches e1 and e3, among the switches e1 to e4 constituting the connection switching circuit 90, and turns off the switches e2 and e4. Additionally, the control unit 60 controls the switches c1 and c2 inside the operational amplifier 30 so as to form the first circuit connection shown in FIG. 2A. That is, the control unit 60 controls the switch c1 such that the terminal y1 is connected to the terminal y3, and the switch c2 such that the terminal y4 is connected to the terminal y6. By controlling the switches as described above, the control unit 60 acquires digital data Sd corresponding to the difference voltage Vout for the battery cell s2 by forward direction measurement.

The control unit 60 calculates, as the measurement value for the cell voltage of the battery cell s2, the average of the digital data Sd corresponding to the difference voltage Vout indicated in formula (3) acquired by reverse direction measurement and the digital data Sd corresponding to the difference voltage Vout indicated in formula (4) acquired by forward direction measurement.

Similarly thereafter, when performing forward direction measurement for each battery cell, the control unit 60 controls the switches a1 to a26 constituting the battery cell selection circuit 10 such that the anode of the battery cell is connected to the node n1, and the cathode of the battery cell is connected to the node n2. Also, when performing forward direction measurement on each battery cell, the control unit 60 turns on the switches e1 and e3, among the switches e1 to e4 constituting the connection switching circuit 90, and turns off the switches e2 and e4. On the other hand, when performing reverse direction measurement for each battery cell, the control unit 60 controls the switches a1 to a26 constituting the battery cell selection circuit 10 such that the anode of the battery cell is connected to the node n2, and the cathode of the battery cell is connected to the node n1. Also, when performing reverse direction measurement on each battery cell, the control unit 60 turns on the switches e2 and e4, among the switches e1 to e4 constituting the connection switching circuit 90, and turns off the switches e1 and e3.

The control unit 60 calculates, for each of the battery cells s1 to s12, the average of the digital data Sd corresponding to the difference voltage Vout acquired by forward direction measurement and the digital data Sd corresponding to the difference voltage Vout acquired by reverse direction measurement. The control unit 60 outputs the calculated value as a measurement value for the cell voltage of the battery cell.

According to the semiconductor device 102 of the present embodiment, similar to the semiconductor device 100 of Embodiment 1, it is possible to shorten the measurement time for the cell voltage compared to the comparison example. According to the semiconductor device 102 of the present embodiment, it is possible to acquire a measurement value for cell voltage that does not include the offset voltage Vof for the battery cells s1 to s12. Additionally, according to the measurement method for cell voltage according to the semiconductor device 102 of the present embodiment, offsets resulting from variations in the resistors R1 to R4 can also be canceled out.

In the semiconductor device 102 of the present embodiment, the buffer circuits 71 and 82 shown in FIG. 5 may, respectively, be provided between the node n1 and the resistor R1 and between the node n2 and the resistor R2. In such a case, there is no need to perform switching on the switches d1 to d8 or to switch the internal circuit connections inside the buffer circuits 71 and 81.

In Embodiments 1 to 3, a case was described in which the first measurement for the battery cell s1, which is the first battery cell for which the cell voltage is to be measured, was performed by forward direction measurement and the second measurement for the battery cell s1 was performed by reverse direction measurement, but the first measurement for the battery cell s1 may be performed by reverse direction measurement and the second measurement for the battery cell s1 may be performed by forward direction measurement.

Also, in Embodiments 1 to 3, a case was described in which measurement of the cell voltage is performed starting with the lowest order battery cell s1, after which the cell voltage of the next order battery cell is measured, but the battery cell for which to measure the cell voltage may be selected in any order.

The cell voltage input terminals x0 to x12 are an example of cell voltage input terminals. The operational amplifier 30 is an example of a difference voltage output circuit. The battery cell selection circuit 10 and the input voltage switching circuit 20 are an example of a connection circuit. The control unit 60 is an example of a control unit and a calculation unit. The buffer circuits 71 and 81 are an example of a pair of buffer circuits. The resistors R1 to R4 are an example of first to fourth resistors. The forward direction measurement and the reverse direction measurement are examples of first and second voltage measurements.

What is claimed is:

1. A semiconductor device for measuring a cell voltage of each of a plurality of serially-connected battery cells in a battery assembly, each battery cell having an anode and a cathode, the semiconductor device comprising:
    a plurality of cell voltage input terminals for connecting the plurality of serially-connected battery cells thereto, each battery cell corresponding to two of the cell voltage input terminals for respectively connecting the anode and the cathode of said each battery cell;
    a difference voltage output circuit having a first input terminal and a second input terminal, and being configured to output a difference voltage based on a difference between voltages inputted respectively to the first and second input terminals;
    a connection circuit configured to connect each battery cell to the different voltage output circuit in either
        a first connection state in which two cell voltage input terminals corresponding to said each battery cell are respectively connected to the first and second input terminals, or
        a second connection state in which the two cell voltage input terminals corresponding to said battery cell are respectively connected to the second and first input terminals; and
    a control unit configured to control the connection circuit for sequentially measuring the cell voltages of the serially-connected battery cells, by, for each battery cell, connecting said each battery cell to the difference voltage output circuit twice, each in a different one of the first and second connection states for consecutively performing a first voltage measurement and a second voltage measurement on said each battery cell, wherein
    a connection state in which the first voltage measurement is performed on each battery cell is the same as a connection state in which the second voltage measurement is performed on one of the battery cells measured immediately prior thereto.

2. The semiconductor device according to claim 1, wherein
    the difference voltage output circuit outputs a first difference voltage and a second difference voltage respectively in the first and second voltage measurements; and
    the control unit is configured to calculate a measurement value using the first and second difference voltages outputted from the difference voltage output circuit for each battery cell.

3. The semiconductor device according to claim 1, wherein the control unit controls the difference voltage output circuit to form first and second circuit connections therein respectively when the voltage inputted to the first input terminal is greater than, or no greater than, the voltage inputted to the second input terminal.

4. The semiconductor device according to claim 1, wherein
    the connection circuit includes a plurality of first switches, each of which is configured to selectively connect one of the plurality of cell voltage input terminals to a first node or a second node for connecting to the first or second input terminal, and
    the control unit controls each of the plurality of first switches to be on or off.

5. The semiconductor device according to claim 4, wherein
    the connection circuit further includes a plurality of second switches, each of which is configured to selectively connect a third node corresponding to the first node and a fourth node corresponding to the second node to the first input terminal or the second input terminal, and
    the control unit controls each of the plurality of second switches to be on or off.

6. The semiconductor device according to claim 1, further comprising:
    first and second buffer circuits respectively formed between the plurality of cell voltage input terminals and the first input terminal, and between the plurality of cell voltage input terminals and the second input terminal, of the difference voltage output circuit, and configured to perform impedance conversion on the cell voltage of each battery cell to output a converted voltage to the difference voltage output circuit.

7. The semiconductor device according to claim 6, wherein
    each of the first and second buffer circuits includes a first buffer input terminal, a second buffer input terminal, and a buffer output terminal, and is configured to switch between
        a first buffer connection in which a voltage from one of the battery cells is inputted to the first buffer input terminal, and the second buffer input terminal is connected to the buffer output terminal, and
        a second buffer connection in which the voltage from the one of the battery cells is inputted to the second buffer input terminal, and the first buffer input terminal is connected to the buffer output terminal, and
    the control unit controls each of the first and second buffer circuits to form the first buffer connection or the second buffer connection according to a switching between the first connection state and the second connection state for each battery cell.

8. The semiconductor device according to claim 1, wherein
the difference voltage output circuit further includes:
- a first resistor having two terminals, one of which receives a cell voltage of one of the battery cells, and the other of which is connected to the first input terminal,
- a second resistor having two terminals, one of which is connected to the first input terminal,
- a third resistor having two terminals, one of which receives a cell voltage of one of the battery cells, and the other of which is connected to the second input terminal,
- a fourth resistor having two terminals, one of which is connected to the second input terminal,
- a first switch provided between the other terminal of the second resistor and a fixed potential,
- a second switch provided between said the other terminal of the second resistor and an output terminal of the difference voltage output circuit,
- a third switch provided between the other terminal of the fourth resistor and the output terminal of the difference voltage output circuit, and
- a fourth switch provided between said the other terminal of the fourth resistor and the fixed potential; and the control unit controls the difference voltage output circuit
- to turn on the first switch and the third switch and to turn off the second switch and the fourth switch in the first connection state of each battery cell, and
- to turn on the second switch and the fourth switch and to turn off the first switch and the third switch in the second connection state of each battery cell.

9. A method for measuring a cell voltage of each of a plurality of serially-connected battery cells in a battery assembly using a difference voltage output circuit having first and second input terminals, the method comprising the steps of:

sequentially measuring the cell voltages of the serially-connected battery cells by, for each battery cell, consecutively performing a first voltage measurement and a second voltage measurement on said each battery cell, during which said each battery cell is connected to the different voltage output circuit twice, each in a different one of
- a first connection state, in which an anode voltage of said each battery cell is inputted to the first input terminal, and a cathode voltage of said each battery cell is inputted to the second input terminal, and
- a second connection state, in which said anode voltage is inputted to the second input terminal, and said cathode voltage is inputted to the first input terminal, wherein a connection state in which the first voltage measurement is performed on each battery cell is the same as a connection state in which the second voltage measurement is performed on one of the battery cells measured immediately prior thereto.

* * * * *